US012795870B2

(12) United States Patent
Masoudi et al.

(10) Patent No.: US 12,795,870 B2
(45) Date of Patent: Nov. 10, 2026

(54) COOLING ARRANGEMENT

(71) Applicant: Solace Power Inc., Mount Pearl (CA)

(72) Inventors: Mehdi Masoudi, St Johns (CA); Maddison Osmond, Mount Pearl (CA); Noah Hansen, Mount Pearl (CA)

(73) Assignee: Solace Power Inc., Mount Pearl (CA)

( * ) Notice: Subject to any disclaimer, the term of this patent is extended or adjusted under 35 U.S.C. 154(b) by 307 days.

(21) Appl. No.: 18/463,959

(22) Filed: Sep. 8, 2023

(65) Prior Publication Data

US 2024/0098948 A1 Mar. 21, 2024

Related U.S. Application Data

(60) Provisional application No. 63/405,154, filed on Sep. 9, 2022.

(51) Int. Cl.
*H05K 7/20* (2006.01)

(52) U.S. Cl.
CPC .................................. *H05K 7/2089* (2013.01)

(58) Field of Classification Search
CPC ...... H02J 50/00; H02J 50/005; H05K 7/2089; H05K 7/209; H05K 7/20909
See application file for complete search history.

(56) References Cited

U.S. PATENT DOCUMENTS

| | | | | |
|---|---|---|---|---|
| 9,653,948 | B2 | 5/2017 | Polu et al. | |
| 10,033,225 | B2 | 7/2018 | Polu et al. | |
| 10,424,942 | B2 | 9/2019 | Nyberg et al. | |
| 11,139,690 | B2 | 10/2021 | Bartlett et al. | |
| 11,310,934 | B2 * | 4/2022 | Los | H02J 50/12 |
| 11,637,453 | B2 | 4/2023 | Rouse et al. | |
| 11,848,565 | B2 * | 12/2023 | Powell, Jr. | H02J 50/005 |
| 12,348,049 | B2 * | 7/2025 | Hsiao | H02J 50/402 |
| 2018/0262015 | A1 | 9/2018 | Nyberg et al. | |
| 2019/0014683 | A1 * | 1/2019 | Han | H02J 50/10 |
| 2019/0229550 | A1 * | 7/2019 | Kim | H02J 50/005 |
| 2020/0099254 | A1 | 3/2020 | Bartlett et al. | |
| 2020/0203997 | A1 | 6/2020 | Cove | |
| 2020/0203998 | A1 | 6/2020 | Almudallal et al. | |
| 2020/0227941 | A1 | 7/2020 | Almudallal et al. | |
| 2021/0021160 | A1 | 1/2021 | Bartlett et al. | |
| 2022/0217866 | A1 * | 7/2022 | Wu | H05K 7/20145 |

FOREIGN PATENT DOCUMENTS

| | | |
|---|---|---|
| EP | 2858206 A1 | 4/2015 |
| EP | 3306773 A1 | 4/2018 |

OTHER PUBLICATIONS

International Search Report and Written Opinion For PCT/CA2023/051195 mailed Jan. 2, 2024.

* cited by examiner

*Primary Examiner* — Jayprakash N Gandhi
*Assistant Examiner* — Matthew Sinclair Muir
(74) *Attorney, Agent, or Firm* — Harness, Dickey & Pierce, P.L.C.

(57) ABSTRACT

A cooling arrangement for a wireless power transfer system comprising a transmitter and a receiver for receiving electrical power from a transmitter is provided. The cooling arrangement comprises a housing arrangement for enclosing a receiver of a wireless power transfer system. The housing arrangement is adapted to provide a flow path between a cooling element powered by a transmitter of a wireless power transfer system or a power source for powering the transmitter, and the receiver.

17 Claims, 13 Drawing Sheets

COOLING ARRANGEMENT

CROSS-REFERENCE TO RELATED APPLICATIONS

The subject application claims the benefit of U.S. Provisional Application No. 63/405,154 filed on Sep. 9, 2022, the entire content of which is incorporated herein by reference.

FIELD

The subject disclosure relates generally to wireless power transfer, and in particular to a cooling arrangement for a wireless power transfer system, a wireless power transfer system and a method of cooling a wireless power transfer system.

BACKGROUND

Wireless power transfer systems such as wireless charging are becoming an increasingly important technology to enable the next generation of devices. The potential benefits and advantages offered by the technology is evident by the increasing number of manufacturers and companies investing in the technology.

A variety of wireless power transfer systems are known. A typical wireless power transfer system includes a power source electrically connected to a wireless power transmitter, and a wireless power receiver electrically connected to a load.

In magnetic induction systems, the transmitter has a transmitter coil with a certain inductance that transfers electrical energy from the power source to the receiver, which has a receiver coil with a certain inductance. Power transfer occurs due to coupling of magnetic fields between the coils or inductors of the transmitter and receiver. Such induction system may non-resonant or resonant. In resonant magnetic induction the inductors are resonated using capacitors. The range of power transfer in resonant magnetic systems may be increased over that of magnetic induction systems and alignment issues may be rectified.

In electrical induction systems, the transmitter and receiver have capacitive electrodes. Power transfer occurs due to coupling of electric fields between the capacitive electrodes of the transmitter and receiver. Similar, to resonant magnetic systems, there exist resonant electric systems in which the capacitive electrodes of the transmitter and receiver are made resonant using inductors, e.g., coils. Resonant electric systems may have an increased range of power transfer compared to that of electric induction systems and alignment issues may be rectified.

While some wireless power transfer systems are known, improvements are desired. It is therefore an object to provide a cooling arrangement for a wireless power transfer system, wireless power transfer system and/or method of cooling a receiver.

This background serves only to set a scene to allow a person skilled in the art to better appreciate the following description. Therefore, none of the above discussion should necessarily be taken as an acknowledgement that the discussion is part of the state of the art or is common general knowledge. One or more aspects/embodiments of the invention may or may not address one or more of the background issues.

SUMMARY

Accordingly, in one aspect there is provided a cooling arrangement for a wireless power transfer system comprising a transmitter and at least one receiver for receiving power from a transmitter.

The cooling arrangement may improve the performance of the wireless power transfer system. In particular, the cooling arrangement may provide cooling to the receiver, but be powered by the transmitter. Providing cooling to the receiver while not drawing power from the receiver may maximize power transfer efficiency between the transmitter and receiver of the wireless power transfer system.

Power transfer efficiency is defined as the ratio of electrical power output by a transmitter to electrical power received or extracted by the receiver of a wireless power transfer system. A higher power transfer efficiency indicates more electrical power is being received at the receiver or extracted by the transmitter.

The cooling arrangement may comprise:

a housing arrangement for enclosing a receiver of a wireless power transfer system, the housing arrangement adapted to provide a flow path between a cooling element powered by a transmitter of a wireless power transfer system or power supply for powering a transmitter of a wireless power transfer system, and the receiver.

The cooling element may be for cooling the receiver, or at least a portion of the receiver.

The transmitter may be electrically connected to a power source for providing a power signal for transferring power wirelessly.

The receiver may be electrically connected to a load for receiving power extracted by the receiver via wireless power transfer. The load may comprise one or more batteries.

As the cooling element is powered by the transmitter or by power from a power supply which also powers the transmitter. The cooling element does not draw power from the receiver. This ensures power received or extracted by the receiver through wireless power transfer is used for powering a load electrically connected to the receiver, rather than the cooling element. Power transfer efficiency may accordingly be maximized. However, the receiver is still cooled which protects the receiver from overheating with negatively impacting power to a load electrically connected to the receiver.

The flow path may provide a path for cooling fluid from the cooling element to the receiver. The cooling fluid may be cool air, or some other gas. Alternatively, or additionally, the cooling fluid may be cooling liquid such as water.

The receiver may be adapted to extract power from a field generated by a transmitter of a wireless power transfer system. The field may be a magnetic field and/or an electric field. The receiver may extract power via magnetic and/or electric field coupling.

The housing arrangement may enclose the receiver, or at least a portion of the receiver. For example, the housing arrangement may enclose components of the receiver which have the greatest heat loss, i.e., high temperature components of the receiver. The components may be mounted on a printed circuit board (PCB) of the receiver. The components with the greatest heat loss may comprise one or more switches. The switches may be mounted on a printed circuit board (PCB) of the receiver. The switches may control one or more operational aspects of the receiver. For example, the switches may control operation of a receiver element for extracting electrical power from a generated magnetic and/or electric field.

The housing arrangement may additionally enclose or be adapted to enclose a transmitter of a wireless power system, or at least a portion of the transmitter. The transmitter may transfer or be adapted to transfer power to the receiver.

The housing arrangement may be for enclosing or may enclose a cooling element for cooling the receiver. The cooling element may additionally cool the transmitter of the wireless power transfer system.

The cooling arrangement may further comprise the cooling element for cooling the receiver, or at least a portion of the receiver. The cooling element may additionally be for cooling the transmitter, or at least a portion of the transmitter.

The cooling element may be enclosed within the housing arrangement.

The housing arrangement may comprise:

a transmitter housing for enclosing a transmitter of a wireless power transfer system, or at least a portion of the transmitter; and at least one receiver housing for enclosing of a receiver of the wireless power transfer system, or at least a portion of the receiver.

The transmitter housing may enclose the transmitter. The receiver housing may enclose the receiver housing.

The transmitter and receiver housing may be engageable. That is to say, the receiver housing may be connectable to the transmitter housing to provide the flow path. The receiver may be disconnected from the transmitter such that the flow path is no longer present, or such that a partial flow path is present. Connection and disconnection of the housings may comprise magnetic connection, physical connection such as post and receiving hole, or the like, or simply placing the receiver housing on the transmitter housing.

Engagement between the transmitter and receiver housing may align inductive elements or capacitive elements of the transmitter and receiver. The inductive elements may comprise coils, and the capacitive elements may comprise capacitors. Aligning these elements may maximise power transfer efficiency between the transmitter and receiver.

The receiver and transmitter may comprise one or more capacitors and inductors. For example, the transmitter and receiver may comprise coils electrically connected to capacitors. The capacitors may be adapted to resonate the coils to extract power via magnetic field coupling. Alternatively or additionally, the transmitter and receiver may comprise capacitors electrically connected to inductors. The inductors may be adapted to resonate the capacitors to extract power via electric field coupling. Power may be extracted via resonant magnetic and/or electric field coupling.

The transmitter housing and receiver housing may be adapted to provide a flow path between a cooling element for cooling at least a portion of the receiver in the receiver housing. The cooling element may be adapted to cool at least a portion of the transmitter in the transmitter housing.

The transmitter housing may enclose the cooling element. The cooling element may be exterior to the transmitter and/or receiver.

The transmitter housing may comprise at least one first opening to provide the flow path from the cooling to the receiver. The opening may provide the flow path from the cooling element to the receiver in the receiver housing.

The transmitter housing may comprise at least one first opening to provide the flow path from the cooling element to the receiver. Cooling fluid may pass through the first opening from the cooling element to the receiver to cool at least a portion of the receiver.

The transmitter housing may have a raised pad and sidewalls extending therefrom. The first opening may be formed in the sidewalls. The sidewalls may extend between the raised pad and a main housing. Four sidewalls may be present. Opening may be formed in each of the sidewalls, or some lesser number, e.g., two of the sidewalls.

The raised pad and/or the opening in the sidewalls may be aligned with components of the receiver. The components of the receiver may be the highest heat components of the receiver, i.e., the components of the receiver which have the greatest heat loss. This alignment may maximize the cooling effect of the cooling element on the receiver. In other words cooling fluid provided by the cooling element may cool the components of the receiver which are in greatest need of cooling.

The transmitter housing may comprise at least one second opening to provide a flow path out of or into out the transmitter housing. The second opening may be in the form of a cut-out. The cut-out may be in the main housing of the transmitter housing. The flow path out of the transmitter housing may provide a fluid intake or exhaust of the cooling element. The cooling element may be enclosed in the transmitter housing, in particular in the main housing. For example, the second opening may provide an intake for a fan through which cool air is circulated to cool the receiver.

The receiver housing may comprise at least one first opening to provide the flow path from the receiver housing to the receiver enclosed in the receiver housing.

The receiver housing may comprise at least one first opening to provide the flow path from the receiver housing to a receiver enclosed in the receiver housing, the first opening adapted to receive the raised pad of the transmitter housing.

A seal may be formed between the raised pad and the first opening in the receiver housing such that cooling fluid from the cooling element does not escape from the flow path. The seal may be defined by mating profiles of the first opening in the receiver housing and the raised pad.

The first opening in the receiver housing and the first opening in the transmitter housing may define the flow path. That is to say, cooling fluid from the cooling element may flow from the transmitter housing, through the first opening in the transmitter housing, through the opening in the receiver housing, and then cool the receiver. For example, a portion of the sidewall (of the transmitter housing) which does not have an opening therein may form an airtight seal with a sidewall of the receiver housing through which the first opening is defined.

The first opening in the receiver housing may be adapted to circumscribe the raised pad. In this context circumscribe is defined as surrounding the raised pad when the receiver housing and transmitter housing are in engagement. A sidewall of the receiver housing defining the first opening may be in contact with the raised paid. The sidewall of the receiver housing may define a seal with the raised paid such that cooling of the receiver by the cooling element is maximized.

The receiver housing may comprise at least one second opening to provide a flow path out of or into the receiver housing. The second opening may be a cut-out in the receiver housing. The cut-out may define a flow path for cooling fluid provided by the cooling element which has cooled the receiver. The cooling fluid may flow from the cooling element through the first opening in the transmitter housing, through the first opening in the receiver housing, cool the receiver (or at least a portion thereon), and then exit the receiver via the second opening, e.g., the cut-out. Alternatively, cooling fluid may return through the openings in the housings and exit from a second opening, e.g. a cut-out, in the transmitter housing.

The receiver and/or transmitter housing may further comprise one or more passive electrodes to at least partially eliminate environmental influences affecting one or more components of the transmitter and receiver housing in the transmitter and receiver housing, respectively. Such a passive electrode is described in applicant's U.S. Pat. No. 11,139,690B2 granted Oct. 5, 2021, the relevant portions of which are incorporated herein by reference.

The passive electrode houses in the receiver housing may further function as a heat sink for components in the receiver housing, such as components which produce significant levels of heat, i.e., high heat components. Additional or alternative heat sinks may also be present in the receiver housing.

The high heat components may be positioned within a cavity of the passive electrode. The cavity may enhance heat dissipation from the high heat components. The cavity may be aligned with fluid flow from the cooling element to further enhance heat dissipation.

The cavity may be filled, at least partially, with an additive to further dissipate heat. The additive may comprise a thermal paste otherwise known as thermal compound, thermal grease, thermal interface material, thermal gel, heat paste, heat sink compound, heat sink paste or CPU grease. The additive is a thermally conductive (but usually electrically insulating) chemical compound, used as an interface between the heat sink and the high heat components. The additive may further enhance heat dissipation.

The housing arrangement may enclose or be for enclosing a plurality of receivers for extracting electrical power from a field generated by a transmitter of a wireless power transfer system. In this configuration, the housing arrangement is many to one, in that there multiple receivers which may be enclosed, but only a single transmitter. Alternatively, the housing arrangement may enclose or be for enclosing a plurality of receiver, and a plurality of transmitter. Each transmitter may be for transferring power via wireless power transfer to one of the respective receivers.

The housing arrangement may comprise:

a plurality of receiver housings, each receiver housing for enclosing a receiver for extracting electrical power from a field generated by a transmitter of a wireless power transfer system.

The housing arrangement may comprise:

a transmitter housing for enclosing a transmitter for transferring power to receivers of a wireless power transfer system.

The transmitter housing and the plurality of receiver housings may be adapted to provide at least one flow path between a cooling element for cooling at least a portion of a transmitter enclosed in the transmitter housing, and at least one receiver enclosed in one of the plurality of receiver housings.

The transmitter housing may comprise at least one opening for providing the flow path. The opening may be in sidewalls extending from a raised pad as described.

At least one receiver housing of the plurality of receiver housings may comprise at least one opening for providing the flow path. The opening may enclose the raised pad upon engage of the receiver housing with the transmitter housing as described. Engagement may comprise connecting the housings in the manner described.

The transmitter housing and the plurality of receiver housings may be adapted to provide a plurality of flow paths, each flow path between the cooling element and a respective receiver enclosed in a respective receiver housing of the plurality of receiver housings.

The transmitter housing may comprise at least one opening for providing the flow path.

Each receiver housing of the plurality of receiver housings may comprise at least one opening to provide a respective flow path between the cooling element and a receiver enclosed in the receiver housing.

The transmitter housing may comprise at least one locator for locating the receiver housing on the transmitter housing. The locator may connect the receiver housing to the transmitter housing upon engagement between the housings. The locator may comprise a post and receiving hole, a pin and hole, a magnetic connection, or the like. For example, a post may extend from the transmitter housing and be receive by a corresponding hole in the receiver housing. Upon the hole receiving the post the receiver housing may be aligned with the transmitter housing such that the openings in the transmitter and receiver housings are aligned. This may maximize cooling fluid flow between the housings and maximize cooling of the receiver.

The transmitter housing and/or receiver housing may further comprise one or more status indicators. Such status indicators may indicate electrical connection between a receiver in the receiver housing and a transmitter in the transmitter housing. For example, the status indicator may indicate electrical power is being transferred from the transmitter to the receiver.

A status indicator may comprise any form of sensory indicator, such as visual, and/or audible indicators. For example, a status indicator may comprise one or more light emitting diodes (LEDs). One LED may indicate power transfer is in progress, while another may indicate power transfer is complete, i.e. a load in the receiver housing has received sufficient electrical power, e.g., a battery has been sufficiently charged. The LEDs may be different colours, for example, red indicating electrical power is being transferred, and green indicating the transfer is sufficiently complete.

Other status indicators are possible. For example, a status indicator may comprise a communication module for communicating a signal to a mobile device or Internet of Things (IoT) device. The communication module may communicate a signal indicating electrical power is being transferred to a software application, for example, or further a signal indicating sufficient electrical power has been transferred. The communication module may also communicate more detailed information such as a specific aspect of the electrical power being transferred such as efficiency, power levels, resistance, power quality, etc.

The cooling element may comprise a fan. As described, the fan is powered by the transmitter or by power from a power supply which also powers the transmitter. The fan does not draw power from the receiver. Thus, power transfer to the receiver is maximized while also providing cooling to the receiver thus ensuring the receiver is cooled, while maximum power is received at a load electrically connected to the receiver.

According to another aspect there is provided a structure for housing a receiver of a wireless power transfer system, the structure adapted to provide a flow path from a cooling element powered by a transmitter of a wireless power transfer system to the receiver.

The structure may be adapted to house the transmitter. The structure may be adapted to house the cooling element.

The structure may provide any of the benefits described in respect of the cooling arrangement.

According to another aspect there is provided a wireless power transfer system comprising a transmitter for transmitting electrical power, a receiver for receiving electrical power from a transmitter, and a cooling arrangement.

The cooling arrangement may comprise:

a housing arrangement for enclosing the receiver, the housing arrangement adapted to provide a flow path between a cooling element powered by the transmitter or a power source for powering the transmitter, and the receiver.

The system may further comprise a power source for powering the transmitter. The power source may also power the cooling element.

The cooling arrangement may be according to any of the described cooling arrangements.

The system may provide any of the benefits described in respect of the cooling arrangement.

According to another aspect there is provided a method of cooling a receiver of a wireless power transfer system.

The method may comprise:

providing a housing arrangement for enclosing a receiver of a wireless power transfer system, and for enclosing a transmitter for transferring power to a receiver of a wireless power transfer system, the housing arrangement adapted to provide a flow path between a cooling element powered by the transmitter or a power supply for powering the transmitter, and the receiver; and operating the cooling element to cool the receiver via the flow path.

According to another aspect there is providing a method of cooling a receiver of a wireless power transfer system, the receiver enclosed in a housing arrangement, the housing arrangement adapted to provide a flow path between a cooling element powered by a transmitter of the wireless power transfer system or a power supply for powering the transmitter, and the receiver, the method comprising:

operating the cooling element to cool the receiver via the flow path.

The methods may provide any of the benefits described in respect of the cooling arrangement.

According to another aspect there is provided a computer-readable medium comprising instructions that, when executed by a processor, performs the described method.

The computer-readable medium may be non-transitory. The computer-readable medium may comprise storage media excluding propagating signals. The computer-readable medium may comprise any suitable memory or storage device such as random-access memory (RAM), static RAM (SRAM), dynamic RAM (DRAM), non-volatile RAM (NVRAM), read-only memory (ROM), or Flash memory.

The processor may have a single-core processor or multiple core processors composed of a variety of materials, such as silicon, polysilicon, high-K dielectric, copper, and so on.

The cooling arrangement may be manufactured moulding, e.g., injection moulding, or conventional subtractive manufacturing techniques.

Alternatively, the cooling arrangement may be manufactured by additive manufacturing. A common example of additive manufacturing is 3D printing; however, other methods of additive manufacturing are available. Rapid prototyping or rapid manufacturing are also terms which may be used to describe additive manufacturing processes. This may relate to the entirety of the cooling arrangement or only certain components thereof.

As used herein, additive manufacturing refers generally to manufacturing processes wherein successive layers of material(s) are provided on each other to "build-up" layer-by-layer or "additively fabricate", a three-dimensional component. This is compared to some subtractive manufacturing methods (such as milling or drilling), wherein material is successively removed to fabricate the part. The successive layers generally fuse together to form a monolithic component which may have a variety of integral sub-components. In particular, the manufacturing process may allow an example of the disclosure to be integrally formed and include a variety of features not possible when using prior manufacturing methods.

Additive manufacturing methods described herein enable manufacture to any suitable size and shape with various features which may not have been possible using prior manufacturing methods. Additive manufacturing can create complex geometries without the use of any sort of tools, molds, or fixtures, and with little or no waste material. Instead of machining components from solid billets of plastic or metal, much of which is cut away and discarded, the only material used in additive manufacturing is what is required to shape the part.

Suitable additive manufacturing techniques in accordance with the present disclosure include, for example, Fused Deposition Modeling (FDM), Selective Laser Sintering (SLS), 3D printing such as by Stereolithography (SLA), Direct Selective Laser Sintering (DSLS), Electron Beam Sintering (EBS), Electron Beam Melting (EBM), Laser Engineered Net Shaping (LENS), Electron Beam Additive Manufacturing (EBAM), Laser Net Shape Manufacturing (LNSM), Direct Metal Deposition (DMD), Digital Light Processing (DLP), Continuous Digital Light Processing (CDLP), Direct Selective Laser Melting (DSLM), Selective Laser Melting (SLM), Direct Metal Laser Melting (DMLM), Direct Metal Laser Sintering (DMLS), Material Jetting (MJ), NanoParticle Jetting (NPJ), Drop On Demand (DOD), Binder Jetting (BJ), Multi Jet Fusion (MJF), Laminated Object Manufacturing (LOM) and other known processes.

The additive manufacturing processes described herein may be used for forming components using any suitable material.

As noted above, the additive manufacturing process disclosed herein allows a single component to be formed from multiple materials. For example, a component may include multiple layers, segments, or parts that are formed using different materials, processes, and/or on different additive manufacturing machines. In this manner, components may be constructed which have different materials and material properties for meeting the demands of any particular application. In addition, although the components described herein are constructed entirely by additive manufacturing processes, it should be appreciated that in alternate embodiments, all or a portion of these components may be formed via casting, machining, and/or any other suitable manufacturing process. Indeed, any suitable combination of materials and manufacturing methods may be used to form these components.

Additive manufacturing processes typically fabricate components based on three-dimensional (3D) information, for example a three-dimensional computer model (or design file), of the component.

Design files can take any now known or later developed file format. For example, design files may be in the Stereolithography or "Standard Tessellation Language" (.stl) format which was created for stereolithography CAD programs of 3D Systems, or the Additive Manufacturing File (.amf) format, which is an American Society of Mechanical Engineers (ASME) standard which is an extensible markup-language (XML) based format designed to allow any CAD software to describe the shape and composition of any three-dimensional object to be fabricated on any additive manufacturing printer.

Further examples of design file formats include AutoCAD (.dwg) files, Blender (.blend) files, Parasolid (.x_t) files, 3D Manufacturing Format (.3mf) files, Autodesk (3ds) files, Collada (.dae) files and Wavefront (.obj) files, although many other file formats exist.

Design files can be produced using modelling (e.g., CAD modelling) software and/or through scanning the surface of a product to measure the surface configuration of the product.

Once obtained, a design file may be converted into a set of computer executable instructions that, once executed by a processer, cause the processor to control an additive manufacturing apparatus to produce a product according to the geometrical arrangement specified in the design file. The conversion may convert the design file into slices or layers that are to be formed sequentially by the additive manufacturing apparatus. The instructions (otherwise known as geometric code or "G-code") may be calibrated to the specific additive manufacturing apparatus and may specify the precise location and amount of material that is to be formed at each stage in the manufacturing process. As discussed above, the formation may be through deposition, through sintering, or through any other form of additive manufacturing method.

The code or instructions may be translated between different formats, converted into a set of data signals and transmitted, received as a set of data signals and converted to code, stored, etc., as necessary. The instructions may be an input to the additive manufacturing system and may come from a part designer, an intellectual property (IP) provider, a design company, the operator, or owner of the additive manufacturing system, or from other sources. An additive manufacturing system may execute the instructions to fabricate the product using any of the technologies or methods disclosed herein.

Design files or computer executable instructions may be stored in a (transitory or non-transitory) computer readable storage medium (e.g., memory, storage system, etc.) storing code, or computer readable instructions, representative of the product to be produced. As noted, the code or computer readable instructions defining the product that can be used to physically generate the object, upon execution of the code or instructions by an additive manufacturing system. For example, the instructions may include a precisely defined 3D model of the product and can be generated from any of a large variety of well-known computer aided design (CAD) software systems such as AutoCAD®, TurboCAD®, DesignCAD 3D Max, etc. Alternatively, a model or prototype of the component may be scanned to determine the three-dimensional information of the component.

Accordingly, by controlling an additive manufacturing apparatus according to the computer executable instructions, the additive manufacturing apparatus can be instructed to print out one or more parts of the cooling arrangement. These can be printed either in assembled or unassembled form. For instance, different portions of the receiver may be printed separately (as a kit of unassembled parts) and then subsequently assembled. Alternatively, the different parts may be printed in assembled form.

In light of the above, embodiments include methods of manufacture via additive manufacturing. This includes the steps of obtaining a design file representing the product and instructing an additive manufacturing apparatus to manufacture the cooling arrangement in assembled or unassembled form according to the design file. The additive manufacturing apparatus may include a processor that is configured to automatically convert the design file into computer executable instructions for controlling the manufacture of the cooling arrangement. In these embodiments, the design file itself can automatically cause the production of the cooling arrangement once input into the additive manufacturing device. Accordingly, in this embodiment, the design file itself may be considered computer executable instructions that cause the additive manufacturing apparatus to manufacture the product. Alternatively, the design file may be converted into instructions by an external computing system, with the resulting computer executable instructions being provided to the additive manufacturing device. The instructions are suitable for execution of a processor and for storage on a non-transitory computer readable storage medium.

Although additive manufacturing technology is described herein as enabling fabrication of complex objects by building objects point-by-point, layer-by-layer, typically in a vertical direction, other methods of fabrication are possible and within the scope of the present subject matter. For example, although the discussion herein refers to the addition of material to form successive layers, one skilled in the art will appreciate that the methods and structures disclosed herein may be practiced with any additive manufacturing technique or other manufacturing technology.

In another aspect there is provided a computer-readable medium comprising instructions that, when executed by a processor, perform any of the described methods. The instructions may operate a controller to perform the described methods. The controller may comprise a PID controller.

In another aspect there is provided a computer-readable medium comprising instructions that, when executed by a processor, cause the processor to control an additive manufacturing apparatus to manufacture any of the described cooling arrangements or systems.

In another aspect there is provided a method of manufacturing a device via additive manufacturing, the method comprising:

obtaining an electronic file representing a geometry of a product wherein the product is any of the described cooling arrangements or systems; and controlling an additive manufacturing apparatus to manufacture, over one or more additive manufacturing steps, the product according to the geometry specified in the electronic file.

The method may provide any of the advantages discussed in respect of the described system, and vice versa.

The computer-readable medium may be non-transitory. The computer-readable medium may comprise storage media excluding propagating signals. The computer-readable medium may comprise any suitable memory or storage device such as random-access memory (RAM), static RAM (SRAM), dynamic RAM (DRAM), non-volatile RAM (NVRAM), read-only memory (ROM), or Flash memory.

The processor may have a single-core processor or multiple core processors composed of a variety of materials, such as silicon, polysilicon, high-K dielectric, copper, and so on.

Given the above, the design and manufacture of implementations of the subject matter and the operations described in this disclosure can be realized using digital electronic circuitry, or in computer software, firmware, or hardware, including the cooling arrangement disclosed in this disclosure and their structural equivalents, or in combinations of one or more of them. For instance, hardware may include processors, microprocessors, electronic circuitry, electronic components, integrated circuits, etc. Implementations of the subject matter described in this disclosure can be realized using one or more computer programs, i.e., one or more modules of computer program instructions, encoded on computer storage medium for execution by, or to control the operation of, data processing apparatus. Alternatively, or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices). The medium may be a non-transitory computer-readable storage medium.

It should be understood that any features described in relation to one aspect, example or embodiment may also be used in relation to any other aspect, example or embodiment of the present disclosure. Other advantages of the present disclosure may become apparent to a person skilled in the art from the detailed description in association with the following drawings.

BRIEF DESCRIPTION OF THE DRAWINGS

Embodiments will now be described more fully with reference to the accompanying drawings in which.

DETAILED DESCRIPTION

Figure 1:
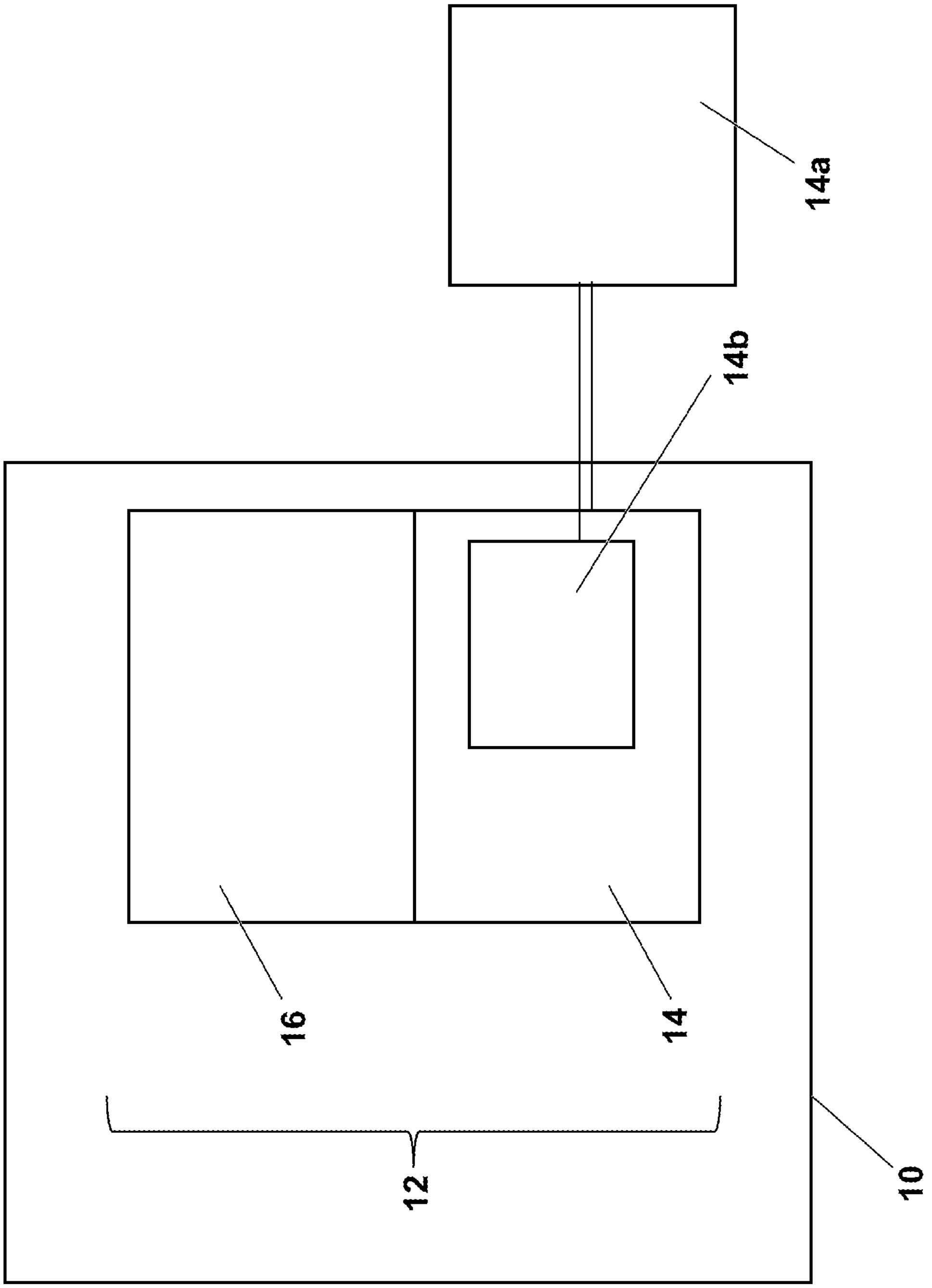
FIG. 1 is a block diagram of a cooling arrangement.

The foregoing summary, as well as the following detailed description of certain examples will be better understood when read in conjunction with the appended drawings. As used herein, an element or feature introduced in the singular and preceded by the word "a" or "an" should be understood as not necessarily excluding the plural of the elements or features. Further, references to "one example" or "one embodiment" are not intended to be interpreted as excluding the existence of additional examples or embodiments that also incorporate the described elements or features. Moreover, unless explicitly stated to the contrary, examples or embodiments "comprising" or "having" or "including" an element or feature or a plurality of elements or features having a particular property may include additional elements or features not having that property. Also, it will be appreciated that the terms "comprises", "has", "includes" means "including but not limited to" and the terms "comprising", "having" and "including" have equivalent meanings. It will also be appreciated that like reference characters will be used to refer to like elements throughout the description and drawings.

As used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, and/or designed for the purpose of performing the function. It is also within the scope of the subject application that elements, components, and/or other subject matter that is described as being adapted to perform a particular function may additionally or alternatively be described as being configured to perform that function, and vice versa. Similarly, subject matter that is described as being configured to perform a particular function may additionally or alternatively be described as being operative to perform that function.

It will be understood that when an element is referred to as being "on," "attached" to, "connected" to, "coupled" with, "contacting," etc., another element, it can be directly on, attached to, connected to, coupled with or contacting the other element or intervening elements may also be present.

It should be understood that use of the word "exemplary", unless otherwise stated, means 'by way of example' or 'one example', rather than meaning a preferred or optimal design or implementation.

Turning now to FIG. 1, a block diagram of a cooling arrangement is illustrated. The cooling arrangement is for a wireless power transfer system comprising a transmitter and receiver. The receiver is for receiving electrical power from the transmitter via magnetic and/or electric field coupling. In the illustrated arrangement, the receiver extracts electrical power from the transmitter via magnetic field coupling. While an electric field may also be generated by the transmitter, little, if any, electrical power is extracted via electric field coupling. As described the components of the transmitter and receiver, e.g. coils and inductors, may be made resonant to improve power transfer efficiency and rectify alignment issues.

Exemplary transmitters and receivers are described in applicant's U.S. Pat. Nos. 9,653,948B2, 10,424942B2, and 10,033,225B2; and US Patent Application Publication Nos 20210021160A1, US20200227941A1, US20200203997A1, US20200203998A1, and US20200099254A1, the relevant portions of which are incorporated herein by reference.

The cooling arrangement 10 comprises a housing arrangement 12. The housing arrangement 12 is for enclosing the receiver. The housing arrangement 12 provides a flow path between a cooling element **14*b* powered by the transmitter or a power source 14*a*** powering the transmitter, and the receiver.

As the cooling element **14*b* is powered by the transmitter or a power source 14*a* powering the transmitter, the cooling element 14*b* does not draw power from the receiver. The cooling element 14*b* cools the receiver through the flow path thereby improving performance of the receiver, and/or reducing heat the receiver. Powering the cooling element 14*b* at the transmit side of the wireless power system comprising the transmitter and receiver ensures the cooling element 14*b*** does not draw power from the receiver. As power is not drawn from the receiver, more power may be provided to a load electrically connected to the receiver. Exemplary loads include batteries, lights, motors, processors, memory, etc.

In the illustrated embodiment, the housing arrangement 12 comprises a receiver housing 16 and a transmitter housing 14. The receiver housing 16 may house a single receiver, or multiple receivers.

While the power source **14*a* is illustrated as being external to the housing arrangement 10, one of skill in the art will appreciate the power source 14*a* may be within the housing arrangement. Specifically, the power source 14*a* may be within the transmitter housing 14**.

Figure 2:
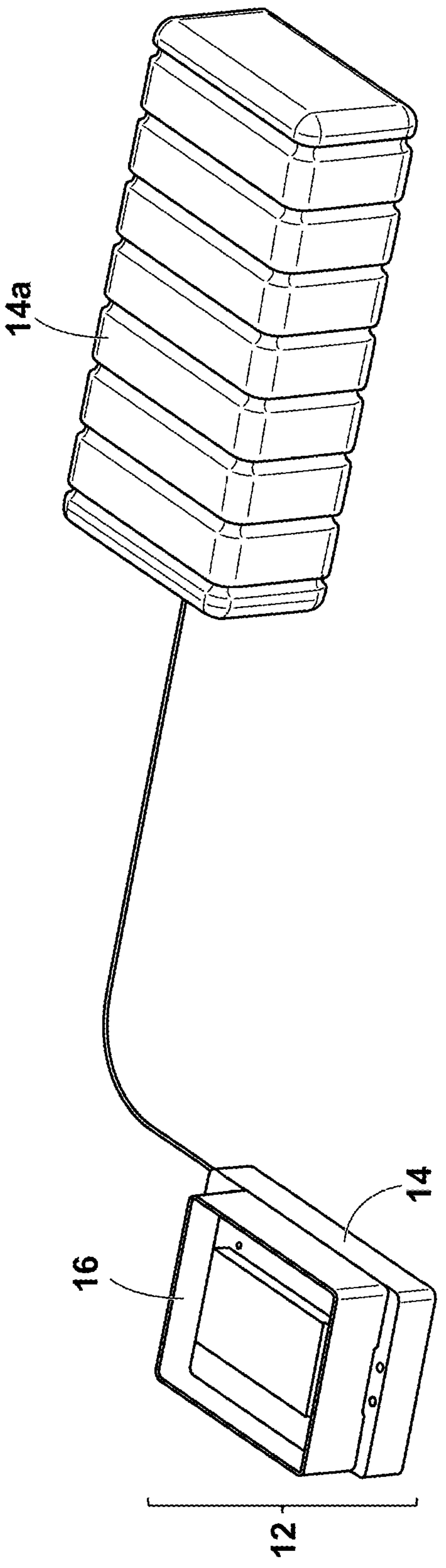
FIG. 2 is a perspective view of a cooling arrangement.

Turning now to FIG. 2, a perspective view of a cooling arrangement is shown. The cooling arrangement is for a wireless power transfer system comprising a transmitter and receiver. The receiver is for receiving electrical power from the transmitter via magnetic and/or electric field coupling. In the illustrated arrangement, the receiver extracts electrical power from the transmitter via magnetic field coupling. While an electric field may also be generated by the transmitter, little, if any, electrical power is extracted via electric field coupling. As described the components of the transmitter and receiver, e.g. coils and inductors, may be made resonant to improve power transfer efficiency and rectify alignment issues.

Exemplary transmitters and receivers are described in applicant's U.S. Pat. Nos. 9,653,948B2, 10,424,942B2, and 10,033,225B2; and US Patent Application Publication Nos 20210021160A1, US20200227941A1, US20200203997A1, US20200203998A1, and US20200099254A1, the relevant portions of which are incorporated herein by reference.

The cooling arrangement comprises a housing arrangement 12. The housing arrangement 12 is for enclosing the receiver as will be described. The housing arrangement 12 provides a flow path between a cooling element powered by the transmitter or a power source **14*a*** powering the transmitter, and the receiver.

As the cooling element is powered by the transmitter or a power source **14*a*** powering the transmitter, the cooling element does not draw power from the receiver. The cooling element cools the receiver through the flow path thereby improving performance of the receiver, and/or reducing heat the receiver. Powering the cooling element at the transmit side of the wireless power system comprising the transmitter and receiver ensures the cooling element does not draw power from the receiver. As power is not drawn from the receiver, more power may be provided to a load electrically connected to the receiver. Exemplary loads include batteries, lights, motors, processors, memory, etc.

Figure 3:
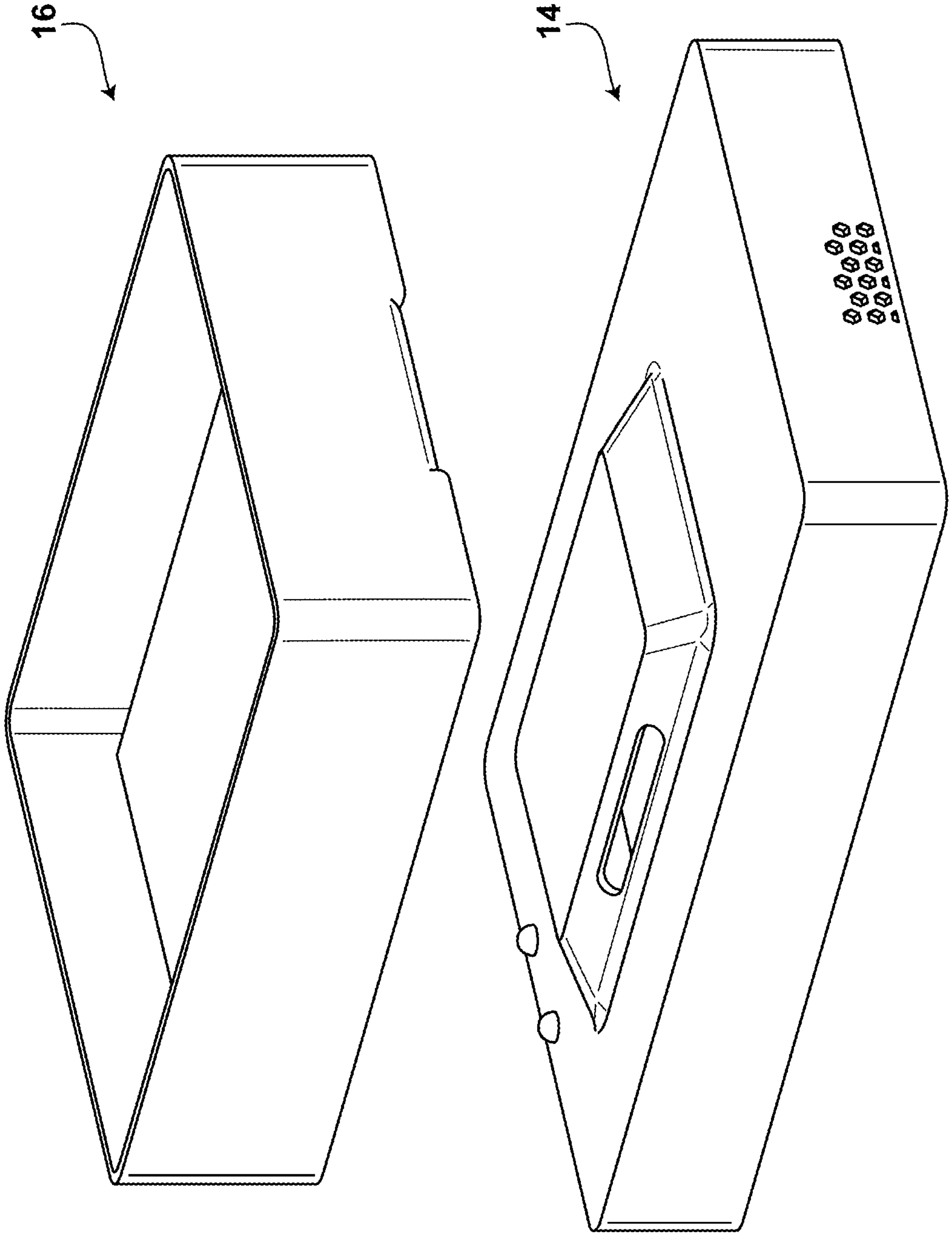
FIG. 3 is a perspective view of another embodiment of a cooling arrangement.

In the illustrated embodiment, the housing arrangement 12 comprises a receiver housing 16 and a transmitter housing 14. While the receiver housing 16 is shown engaged with the transmitter housing 14 in FIG. 2, the receiver housing 16 may be disengaged from the transmitter housing 14 as illustrated in FIG. 3. In fact, the transmitter housing 14 may be disengaged from the receiver housing 16. In other words, the housing 14, 16 are disengageably engageable.

Figure 6:
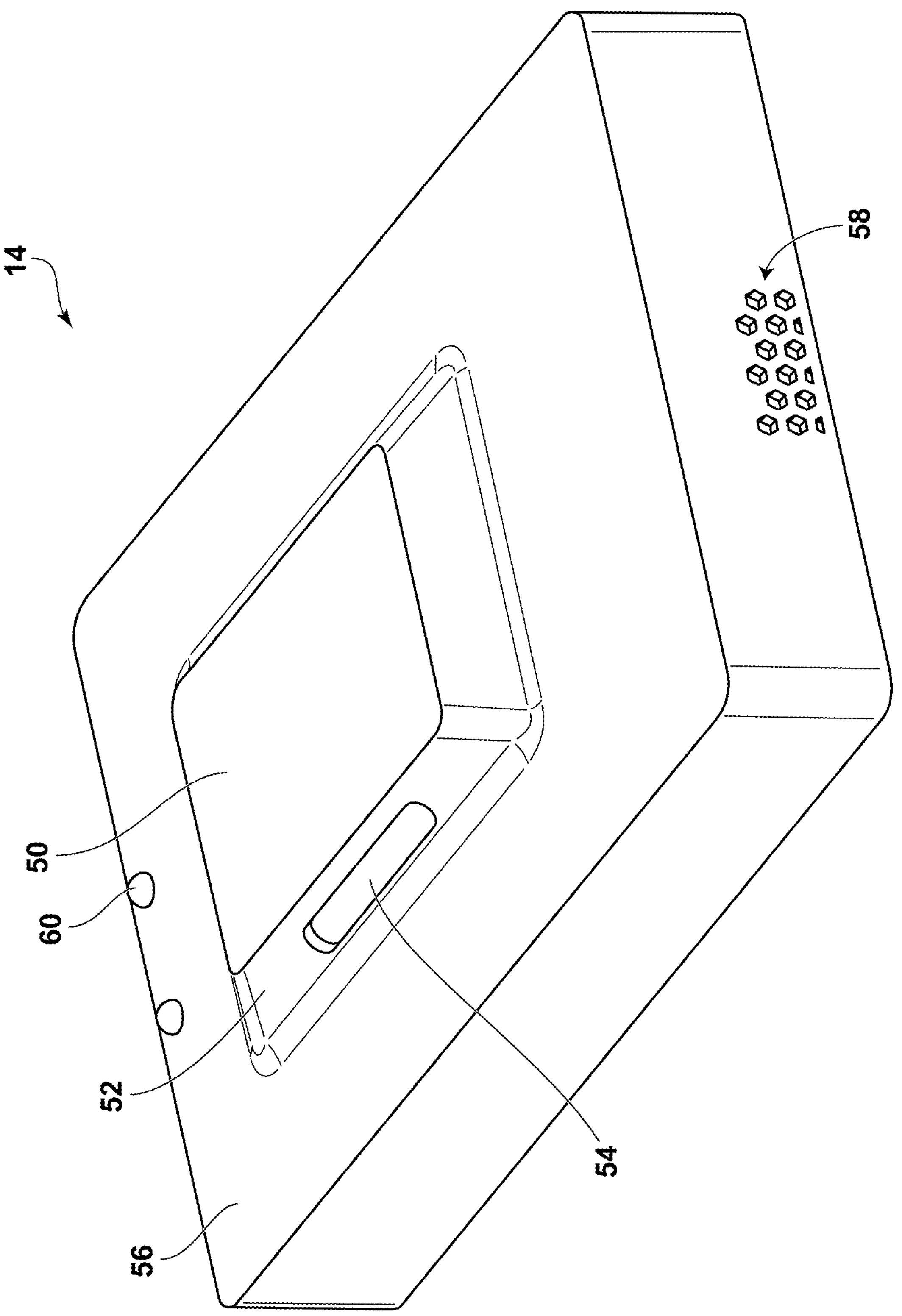
FIG. 6 is perspective view of a transmitter housing of the cooling arrangement of FIG. 2.

The receiver housing 16 of FIG. 2 is illustrated in more detail in FIGS. **4*a*, 4*a* and 5, and the transmitter housing 14 of FIG. 2 is illustrated in more detail in FIG. 6. The housings 14, 16 are shown in engagement in FIGS. 7-9**.

The receiver housing 16 has a generally rectangular shape, although other shapes are possible such as cylindrical or spherical. Generally the receiver housing 16 is sized to accommodate the receiver. The receiver housing 16 may further accommodate other electronics such a load electrically connected to or forming part of the receiver. As previously stated such loads may include batteries and other electronics.

Figure 4A:
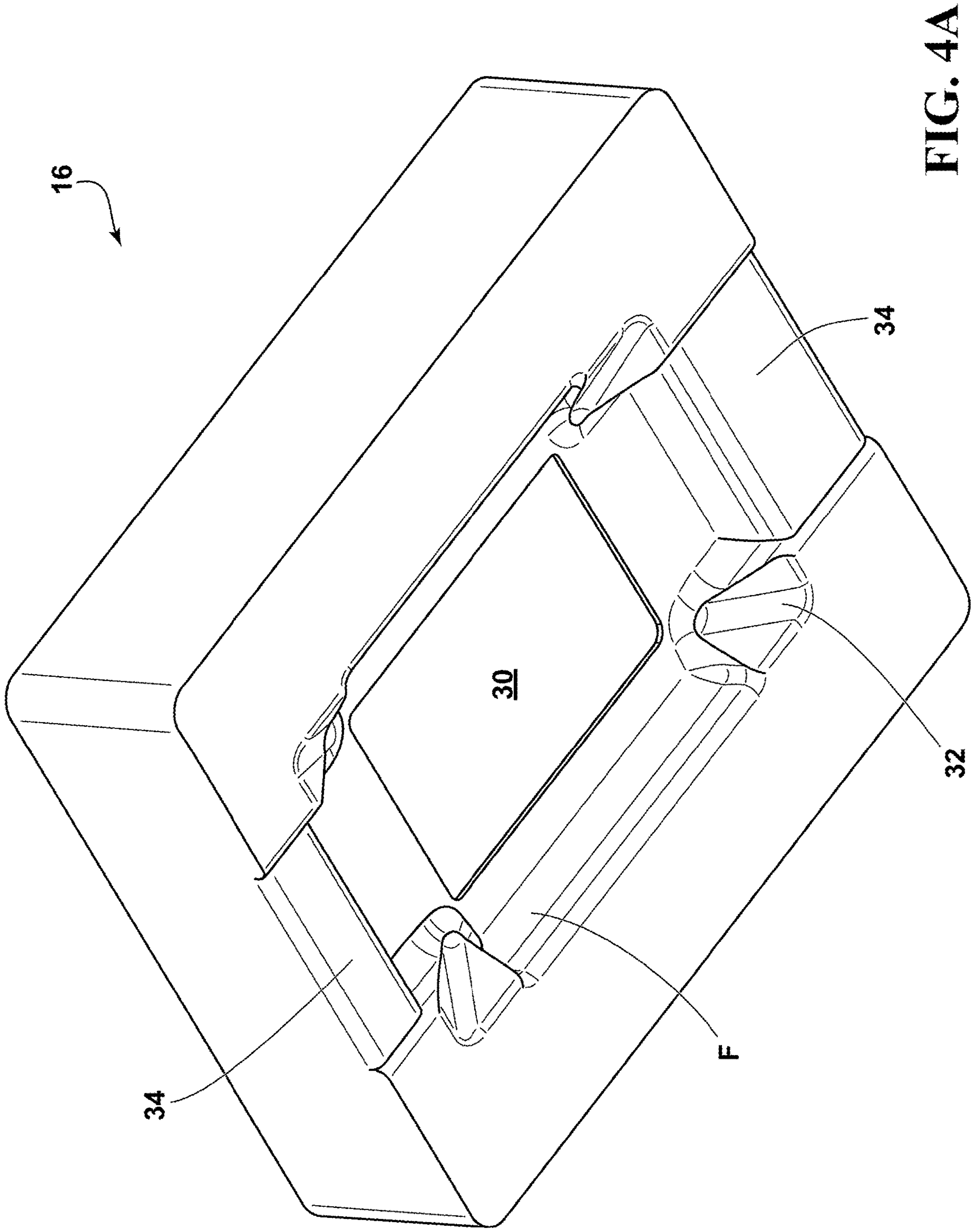
FIG. 4A is a perspective view of a receiver housing of the cooling arrangement of FIG. 2.
Figure 4B:
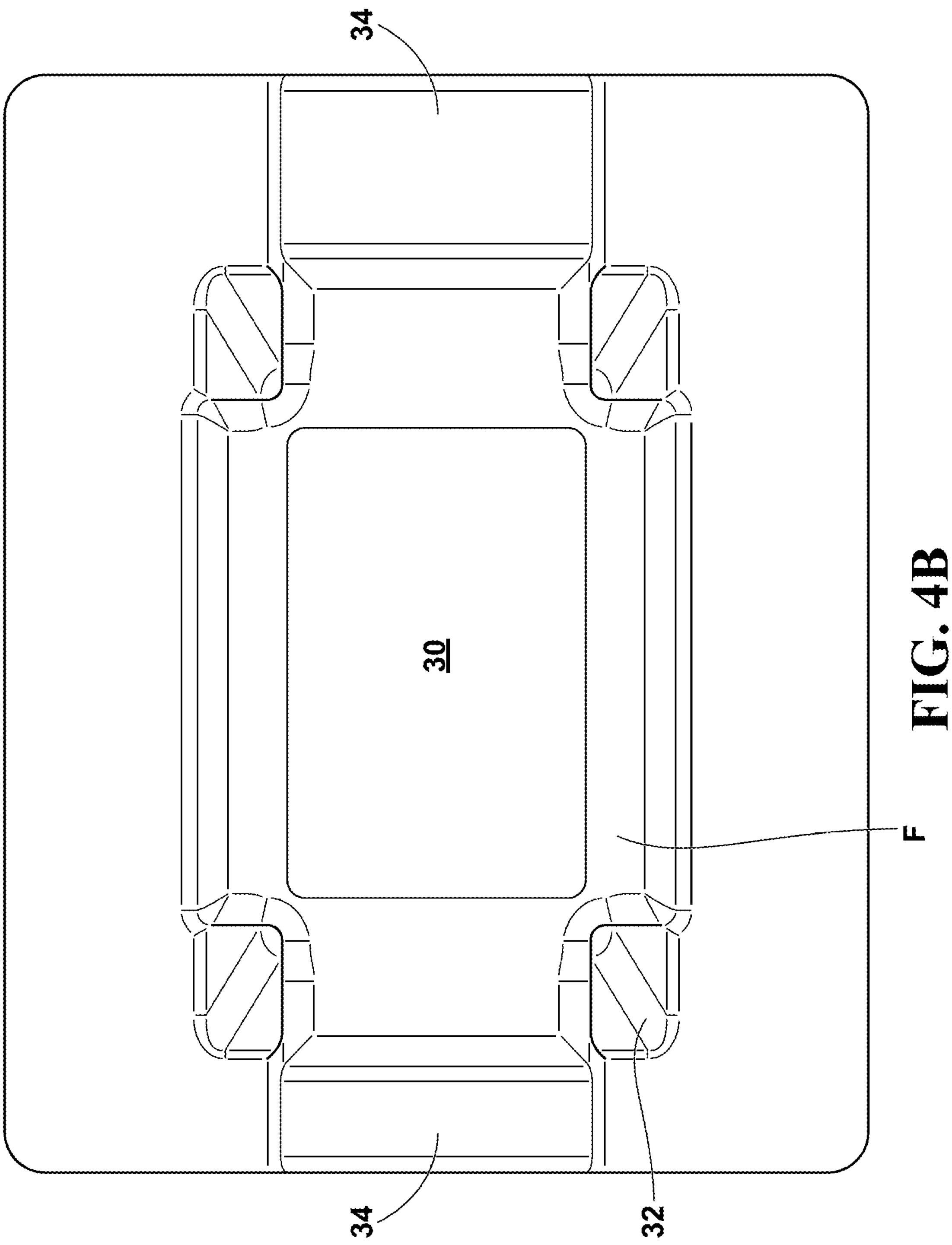
FIG. 4B is a plan view of the receiving housing of FIG. 4A.

As illustrated in FIGS. 4A and 4B, the receiver housing 16 has a first opening which in the illustrated embodiment comprises an aperture 30 central to a planar surface of the receiver housing 16. The central aperture 30 is defined by sidewalls 32 about the circumference of the aperture 30. As will be described the sidewalls 32 form a seal with a portion of the transmitter housing 14 to prevent cooling fluid from (or hot fluid to) the cooling element from escaping the flow path. The flow path is illustrated in FIG. 4A and identified by reference numeral F.

In the illustrated embodiment the receiver housing 16 additionally comprises a second opening. The second opening defines a flow path for cooling fluid which has cooled the receiver to escape the receiver housing 16. In the illustrated embodiment the second opening comprises cut-outs 34 in a body of the receiver housing 16. As illustrated in FIGS. 4A and 4B, the cuts outs provide a flow path between the exterior of the receiving housing 16 and the central aperture 30. In the illustrated arrangement, two cut-outs 34 are present positioned opposite each on either longitudinal end of the receiver housing 16. While a particular receiver housing 16 has been described, one of skill in the art will appreciate other configurations are possible. For example, only a single cut-out may be present, Additionally, the cut-outs may have other configurations on the receiver housing. For example, each side of the receiver housing 16 may comprise a cut-out, i.e., four cut-outs.

Figure 5:
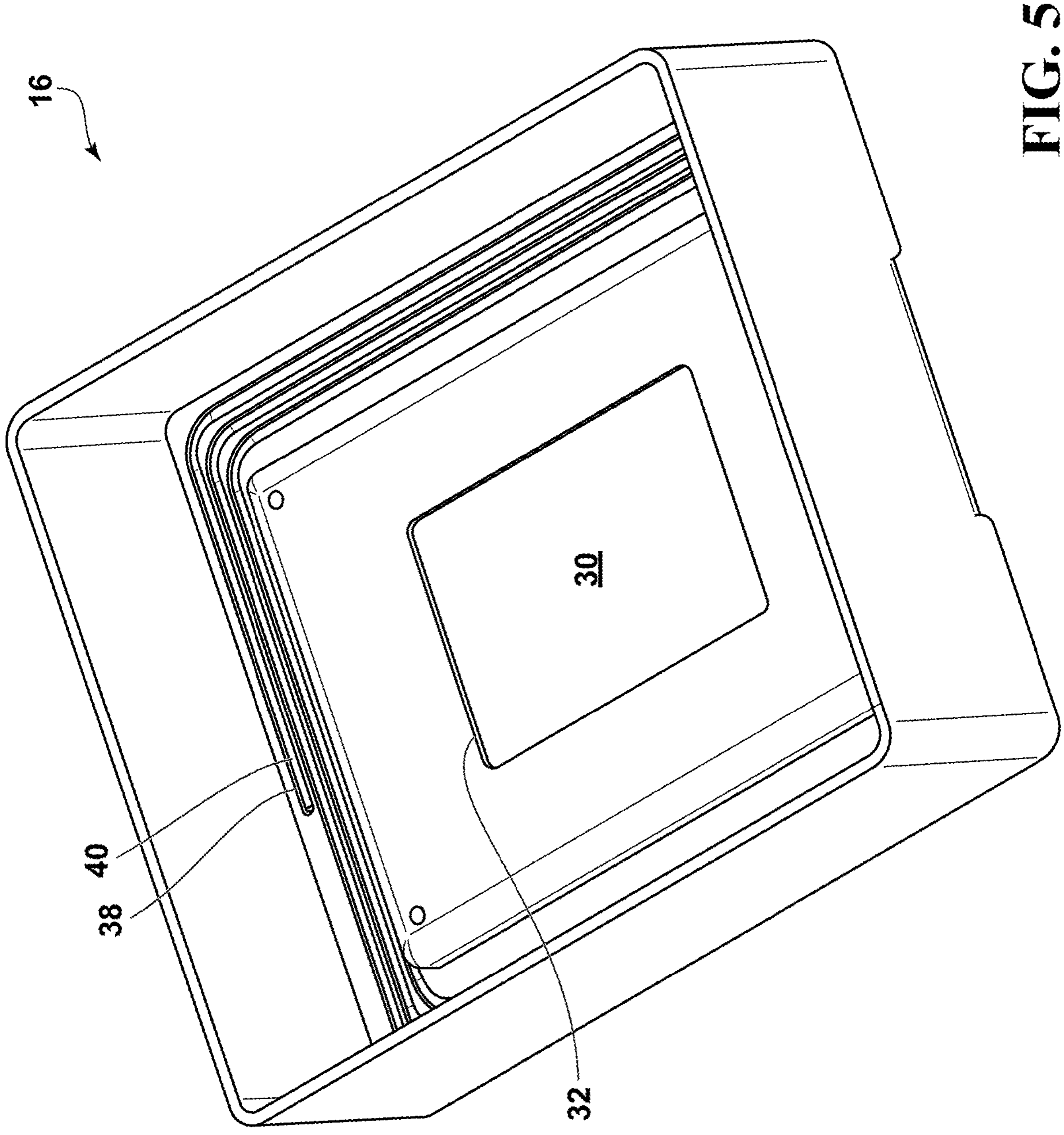
FIG. 5 is an interior perspective view of the receiver housing of FIG. 4A.

As shown in FIG. 5, the receiver housing 16 comprises a recess 38 defined by the sidewalls 32 in an interior of the receiver housing 16. The recess 38 is adapted to receive a receiver coil 40 of the receiver. The positioning of the recess 38 relative to the aperture 30 aligns a receiver coil 40 in the recess 38 with a transmitter coil upon engagement of the receiver housing 16 with the transmitter housing 14 as will be described. Alignment between the coils maximises power transfer between the transmitter and receiver. While a particular receiver coil 40 has been described, one of skill in the art will appreciate other configurations are possible. For example, electrodes may be positioned within the recess for extracting power from an electric field generated by electrodes of a transmitter housed in the transmitter housing 14.

While not shown in FIGS. 4A, 4B and 5, the receiver housing 16 may additionally comprise a locator used to locate the receiver housing 16 relative to the transmitter housing 14. The locator may take the form of a post, while a counterpart locator on the transmitter housing 14 takes the form of a hole or ridge. As one of skill in the art will appreciate, other locators are possible such as magnetic coupling, bumps, grooves, clips, pins, pegs, etc.

Figure 7:
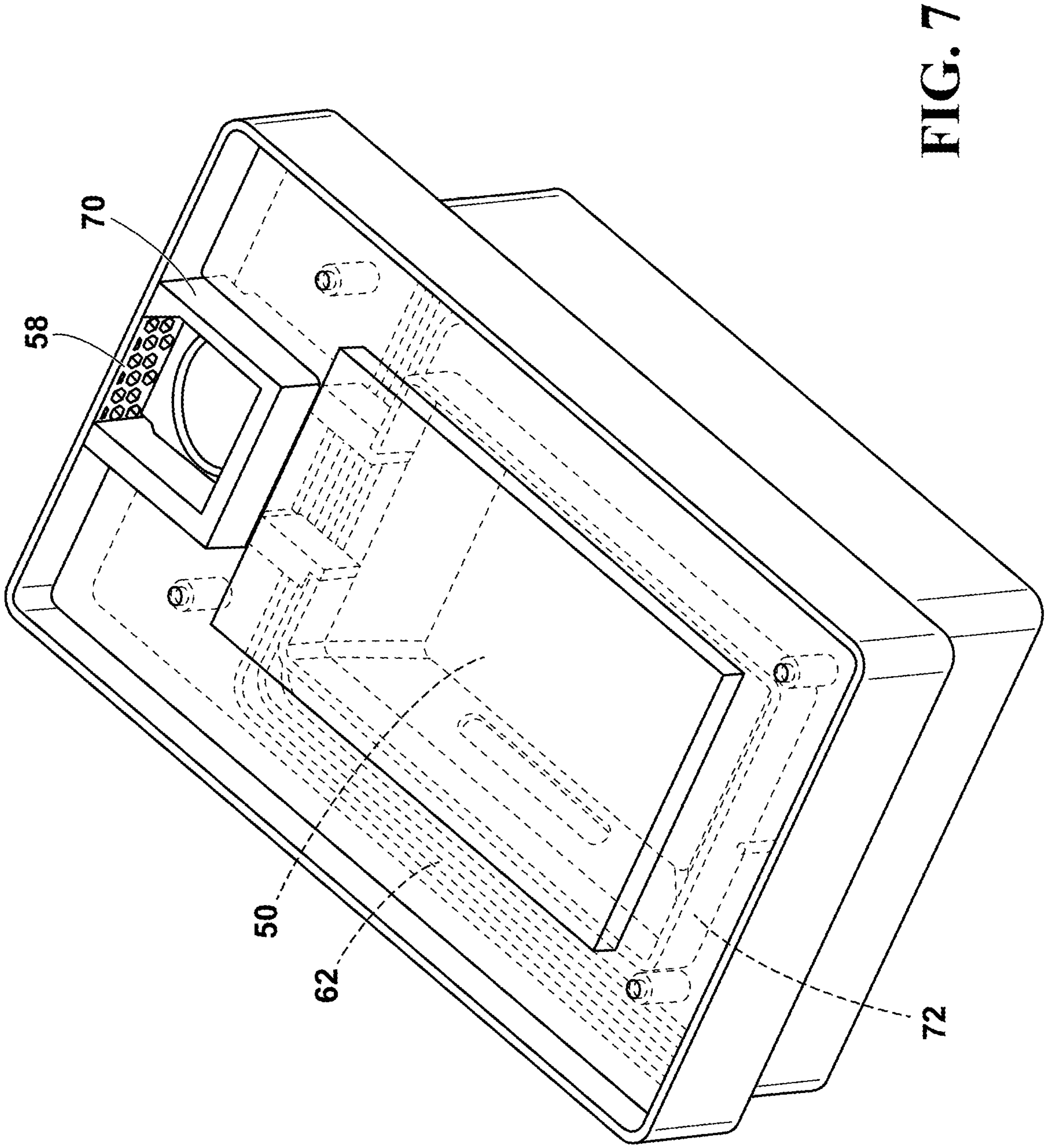
FIG. 7 is an interior perspective view of transmitter housing of FIG. 6.

Turning now to FIGS. 6 and 7, the transmitter housing 14 is shown in more detail. The illustrated transmitter housing 14 has a generally rectangular prism shape. As one of skill in the art will appreciate other shapes are possible, such as cylindrical or spherical.

Further the transmitter housing 14 may be electrically connected to a power source 14*a* illustrated in FIG. 2. Power source 14*a* provides power to components within the transmitter housing 14 such as a transmitter within the transmitter housing 14, and cooling element. The power source 14*a* may be electrically connected to a mains power supply. Alternatively or in addition, the power source 14*a* may comprise one or more batteries to provide electrical power. The power source 14*a* may include a transformer electrically connected to a mains power supply and/or other electrical power source, e.g., one or more batteries.

While a particular configuration of the transmitter housing 14 and the power source 14*a* have been illustrated, one of skill in the art will appreciate other configurations are possible. For example, the power source 14*a* may be contained within the transmitter housing 14. The transmitter housing 14 may be electrically connected to a main power supply and/or other electrical power source, e.g., one or more batteries. Alternatively, the power source 14*a* may take the form of the battery, such that transmitter housing 14 forms a stand-alone unit for providing electrical power to a receiver housed in the receiver housing 16.

The transmitter housing 14 comprises a raised pad 50. Sidewalls 52 having first openings extend from the raised pad 50 a main body 56. In the illustrated embodiment, the first openings take the form of slots 54 in the sidewalls 52. In particular, two slots 54 are present in the sidewalls 52, i.e., one slot 54 in each of two sidewalls 52 of the four sidewalls 52.

The raised pad 50 is a generally plane surface with a rectangular shape that defines a plateau relative to the main body 56 of the transmitter housing 14. The sidewalls 52 extend between the main body 56 and the top surface of the raised pad 50.

The raised pad 50 fits into the central aperture 30 of the receiver housing 16 to create an airtight seal between the transmitter housing 14 and the receiver housing 16. In particular, portions of the sidewalls 52 engage the sidewalls 32 of the aperture 30 to form a seal. This prevents cooling fluid from the cooling element from escaping the flow path (F), and optimizes cooling.

While a particular raised pad 50 has been described, one of skill in the art will appreciate configurations are possible. For example, the transmitter housing 14 may comprise an aperture corresponding with the aperture 30 in the receiver housing 16. A sealing element, such as an O-ring may be positioned between the apertures upon engagement of the housings 14, 16. In this embodiment, no raised pad may be present.

The transmitter housing 14 further comprises a second opening in the form of multiple apertures forming an intake 58 for the cooling element. The intake 58 allows the cooling element to draw cooling fluid (air) in for use in cooling the receiver.

The transmitter housing 14 may further comprise one or more locators for locating the receiver housing 16 on the transmitter housing 14. For example a locator may comprise a post (not shown) which fits into a corresponding hole (not shown) in the receiver housing 16. The post may extend from the transmitter housing for engagement with the hole. The post and hole may connect upon engagement of the housing 14, 16. The post and hole may ensure the housings 14, 16 are aligned such that the raised pad 50 fits securely in the aperture 30 of the receiver housing 16 so cooling fluid does not escape. This maximises cooling of the receiver by the cooling element.

As one of skill in the art will appreciate other locators are possible such as a plug and socket, pin and hole, a magnetic connection or similar.

The transmitter housing 14 may further comprise one or more status indicators. Such status indicators may indicate electrical connection between a receiver in the receiver housing 16 and a transmitter in the transmitter housing 14. For example, the status indicator may indicate electrical power is being transferred from the transmitter to the receiver. A status indicator may comprise any form of sensory indicator, such as visual, and/or audible indicators. In the illustrated arrangement, a status indicator comprises two status light emitting diodes (LEDs) 60. One LED may indicate power transfer is in progress, while the other may indicate power transfer is complete, i.e. a load in the receiver housing 16 has received sufficient electrical power, e.g., a battery has been sufficiently charged. The LEDs 60 may be different colours, for example, red indicating electrical power is being transferred, and green indicating the transfer is sufficiently complete. Other status indicators are possible. For example, a status indicator may comprise a communication module for communicating a signal to a mobile device or Internet of Things (IoT) device. The communication module may communicate a signal indicating electrical power is being transferred to a software application, for example, or further a signal indicating sufficient electrical power has been transferred. The communication module may also communicate more detailed information such as specific aspect of the electrical power being transferred such as efficiency, power levels, resistance, power quality, etc.

The cooling element is located within the transmitter housing 14 as illustrated in FIG. 7. In the illustrated embodiment, the cooling element comprises a fan 70. The fan 70 provides air to the receiver through the slots 54 in the sidewalls 52. Further contained within the transmitter housing 14 is a perimeter wall 72. The perimeter wall 72 serves to guide the cooling air from the fan 70 within the transmitter housing 14 to the slots 54. The cooling air passes through the slots 54 and through the aperture 30 to then cool components of the receiver. The fan 70 draws air to be circulated through the intake 58. The air which flows to cool components of the receivers draws heat from the components. The air, which has now warmed from components of the receiver, exits the receiver housing 16 via at least one of the cut-outs 34.

The fan 70 may alternatively suck air from the receiver through the slots and 54 and aperture 30 expelling the hot air through the intake 58 which functions as an exhaust. In this embodiment the cut-out 34 acts as an intake to the fan 70.

In the illustrated arrangement, the cooling element, that is to say the fan 70, is powered by the power source 14*a*.

A transmitter element is also shown in FIG. 7 within the transmitter housing 14. In the illustrated embodiment the transmitter element takes the form a transmitter coil 62 of the transmitter is also shown in FIG. 7. The transmitter coil 62 is positioned about the periphery of the sidewalls 52 in the interior of the transmitter housing 14. As will be described the positioning of the transmitter coil 62 mirrors the positioning of the receiver coil 40 to align the coils 40, 62 thereby maximising power transfer efficiency.

Further illustrated in FIG. 7 is the raised pad 50 of the receiver housing 16. This is depicted to illustrate the relative placement between the perimeter wall 72 and the raised pad 50.

The transmitter coil 62 generates a magnetic field for transferring electrical power to the receiver. The receiver coil 40 extracts or receives electrical power from the generated field via magnetic field coupling. Little, if any, electrical power is extracted via electric field coupling. The coil 40, 62 may be made resonant in the manner previously described.

While a transmitter coil 62 has been described, one of skill in the art will appreciate that a transmitter electrode may alternatively be used for wireless power transmission. In this embodiment, the transmitter electrode generates an electric field and a receiver electrode of the receiver in the receiver housing 16 extracts or receives electrical power via electric field coupling. Little, if any, electrical power is extracted via magnetic field coupling. The electrodes may be made resonant as previously described.

The housings 14, 16 may be brought into engagement by bringing housing 14, 16 together such the raised pad 50 is positioned with the aperture 30. This provides a flow path from the fan 70, guided by the perimeter wall 72, to receiver via the slots 54 and aperture 30. Such positioning may comprise moving the receiver housing 16 onto the transmitter housing 14.

Figure 8:
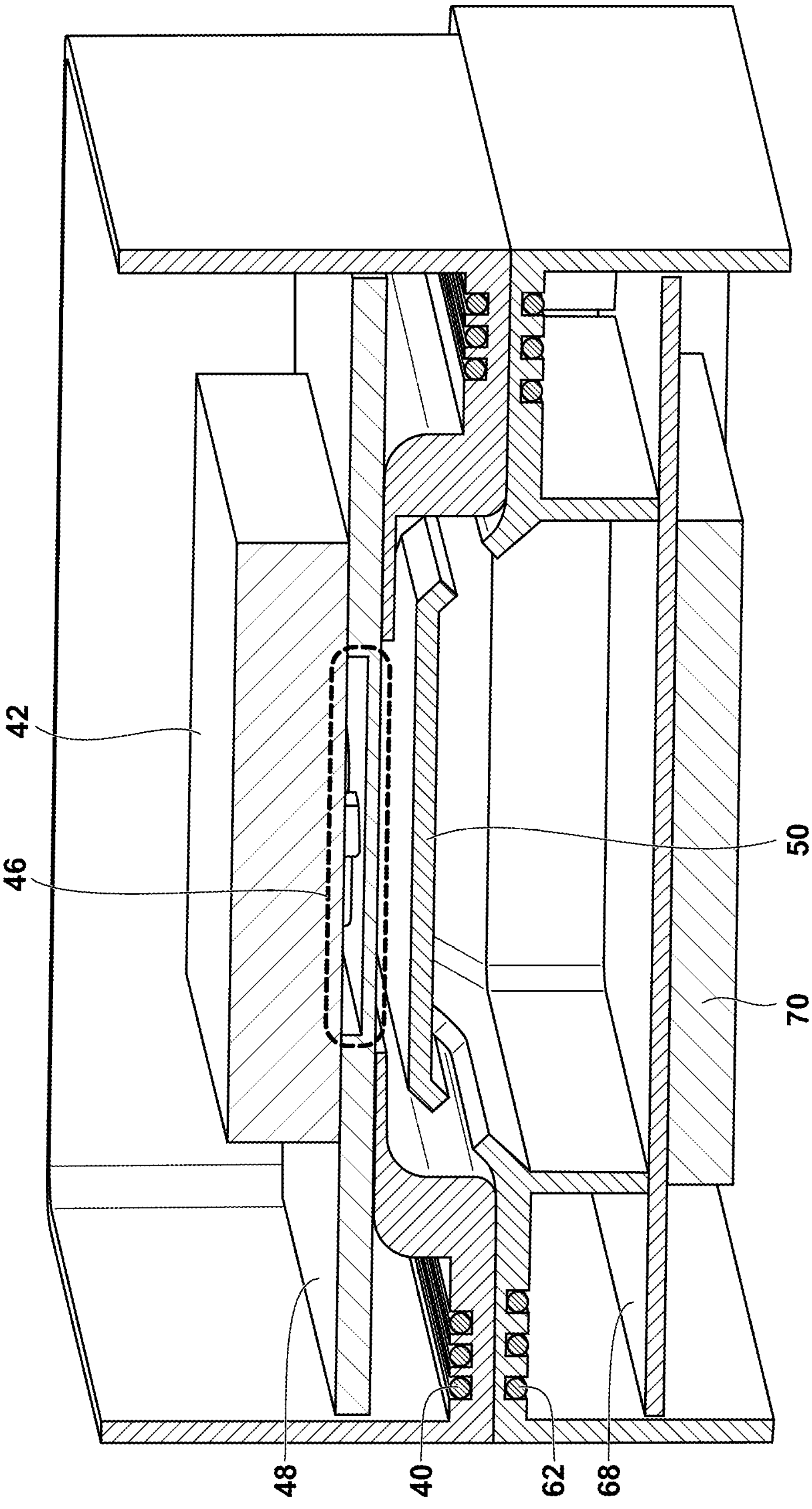
FIG. 8 is a perspective cutaway view of a cooling arrangement with the receiver and transmitter housings in engagement.
Figure 9:
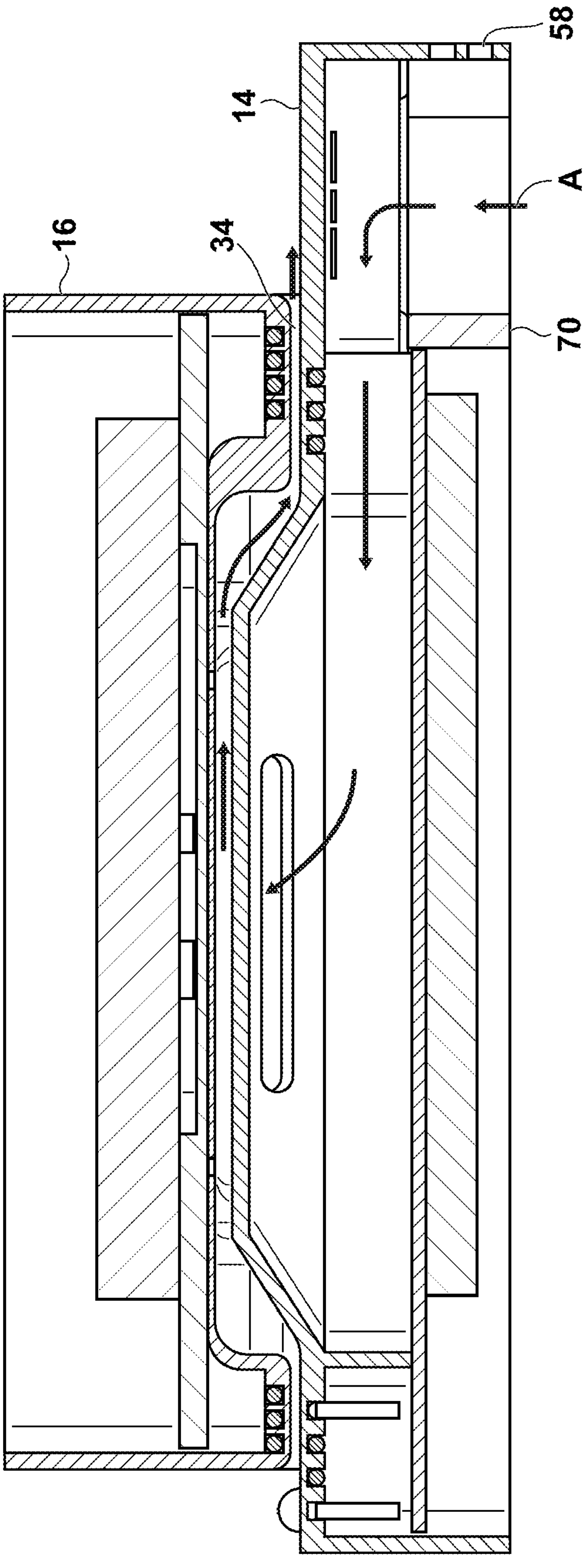
FIG. 9 is another perspective cutaway view of the cooling arrangement of FIG. 8 showing airflow.

Turning now to FIGS. 8 and 9 the housings 14, 16 are shown in engagement. The receiver and transmitter are in the receiver housing 16 and transmitter housing 14, respectively.

Specifically referring to FIG. 8, the receiver is illustrated as comprising the receiver coil 40 and receiver components 42. In the illustrated embodiment the components 42 are mounted on a printed circuit board (PCB). The components 42 may include capacitor(s), inductor(s), resistor(s), DC/DC converter(s), synchronous rectifier(s), and other electrical components. The synchronous rectifier may function and include elements as described in applicant's U.S. patent application Ser. No. 17/472,002, filed on Sep. 10, 2021, the relevant portions of which are incorporated herein by reference.

The components 42 may be electrically connected to or include one or more loads. Exemplary loads include a battery, motors, and lights such as LED.

As described in applicant's U.S. Pat. No. 11,139,690 B2 granted Oct. 5, 2021, the relevant portions of which are incorporated herein by reference, the transmitter and/or receiver may additional comprise one or more passive electrodes to at least partially eliminate environmental influences affecting one or more components of the transmitter and receiver, respectively. In the illustrated arrangement the receiver comprises a passive electrode 48. The passive electrode 48 forms a shield to at least partially eliminate environmental influences affecting one or more of the components 42. The passive electrode 48 forms a plane which is parallel with the plane of PCB. Additionally the plane is parallel with the plane formed by the receiver coil 40.

Some of the components 42 may produce more heat, i.e., have greater heat loss than other components 42. These components are referred to as the high heat components 46. The high heat components 46 may comprise one or more electrical switches mounted on the PCB. The high heat components 46 are positioned on the PCB such that they are aligned with the aperture 30 in the receiver housing 16. By aligning the high heat components 46 with the aperture 30, the fan 70 provides the greatest cooling on the high heat components 46 as the cooling air (or removal of hot air) occurs at the high heat components 46 proximate the aperture 30 and slots 54.

The passive electrode 48 further functions as a heat sink for the high heat components 46. As will be appreciated an additional or alternative heat sink may be present. The passive electrode 48/heat sink assists in heat dissipation of the high heat components 46. As illustrated in FIG. 8 the high heat components 46 are positioned within a cavity of the passive electrode 48. In this embodiment, the cavity is filled with an additive to further dissipate heat. The additive may comprise a thermal paste otherwise known as thermal compound, thermal grease, thermal interface material, thermal gel, heat paste, heat sink compound, heat sink paste or CPU grease. The additive is a thermally conductive (but usually electrically insulating) chemical compound, used as an interface between the passive electrode 48 (acting as a heat sink) and the high heat components 46. The additive serves to maximize heat transfer and dissipation.

Further the receiver coil 40 is aligned with the transmitter coil 62 when the receiver housing 16 is engaged with the transmitter housing 14 to maximize electrical power transfer efficiency between the transmitter and receiver.

A plane formed by the raised pad 50 is generally parallel with a plane of defined by the PCB of the receiver. In this way the raised pad 50 does not interfere with the operation of components on the PCB of the receiver.

As illustrated in FIG. 8, the transmitter comprises the previously-described transmitter coil 62.

The transmitter may comprise additional components. The additional components may include capacitor(s), inductor(s), resistor(s), DC/DC converter(s), synchronous rectifier(s), power supply(s) and other electrical components. The synchronous rectifier may function and include elements as described in applicant's U.S. patent application Ser. No. 17/472,002, filed on Sep. 10, 2021, the relevant portions of which are incorporated herein by reference. In the illustrated embodiment the transmitter components are mounted on a PCB 66.

The power supply provides a power signal to the transmitter coil 62 for generated a magnetic field for wireless power transfer via magnetic field coupling. Additionally the power supply provides electrical power to the fan 70. By powering the fan 70 via a power supply at the transmitter and enclosed in the transmitter housing 14, the fan 70 does not draw power from the receiver and does not negatively impact power transfer efficiency. This can ensure the receiver receives maximum electrical power, while the receiver housing 14 can stay compact as the fan 70 does not need to be present in the receiver housing 14. Further the high heat components 46 of the receiver are sufficiently cooled thereby ensuring optimal operation and compactness of the receiver.

As described in applicant's U.S. Pat. No. 11,139,690B2 granted Oct. 5, 2021, the relevant portions of which are incorporated herein by reference, the transmitter comprises a passive electrode 68. The passive electrode 68 forms a shield to at least partially eliminate environmental influences affecting one or more of the components of the transmitter. The passive electrode 68 forms a plane which is parallel with the plane of PCB 66. Additionally the plane is parallel with the plane formed by the transmitter coil 62. Further the plane of the passive electrode 68 (and therefore transmitter coil 62 and PCB 66) is parallel with the planes of the receiver coil 40, PCB and passive electrode 48 in the receiver housing 16.

As illustrated in FIG. 9 a flow path A for cooling the receiver is illustrated. The fan 70 draws air in through the intake 58. The drawn in air may be cooled at the fan 70, i.e., the fan 70 may be a cooling fan. The air is then propelled within the transmitter housing 14 through the slots 54 in the sidewalls 52. The air then passes through the aperture 30 in the receiver housing 16. As highlighted in FIGS. 4A and 4B, the air passes along the sidewall flow path F of the aperture 30. The flowing air draws hot air (heat) from the high heat components 46 of the receiver. The hot air is then expelled through the cut-out 34 in the receiver housing 16. In this way the high heat components 46 are cooled while not drawing power from the receiver which would negatively impact power received at the load in the receiver housing 16. Further, the cooling fan 70 which cools components of the receiver, being present in the transmitter housing 14, rather than the receiver housing 16, allows the receiver (and receiver housing 16) to be lighter, more compact and less expensive to produce.

While a particular configuration of the housing arrangement 12 has been described, one of skill in the art will appreciate other configurations are possible. In another embodiment the fan 70 draws fluid (e.g., air) from the receiver such that the fluid flow A illustrated in FIG. 9 is reversed, i.e. air is sucked through cut-out 34 and through central aperture 30 as hot air from the high heat components 46 is drawn away from the receiver. The hot air passes through slots 54 and out through intake 58 which acts as an exhaust to the fan 70 in this configuration. The fan 70 cools the receiver, in particular the high heat components 46 of the receiver by removing heat generated at or by these components 46.

Figure 10:
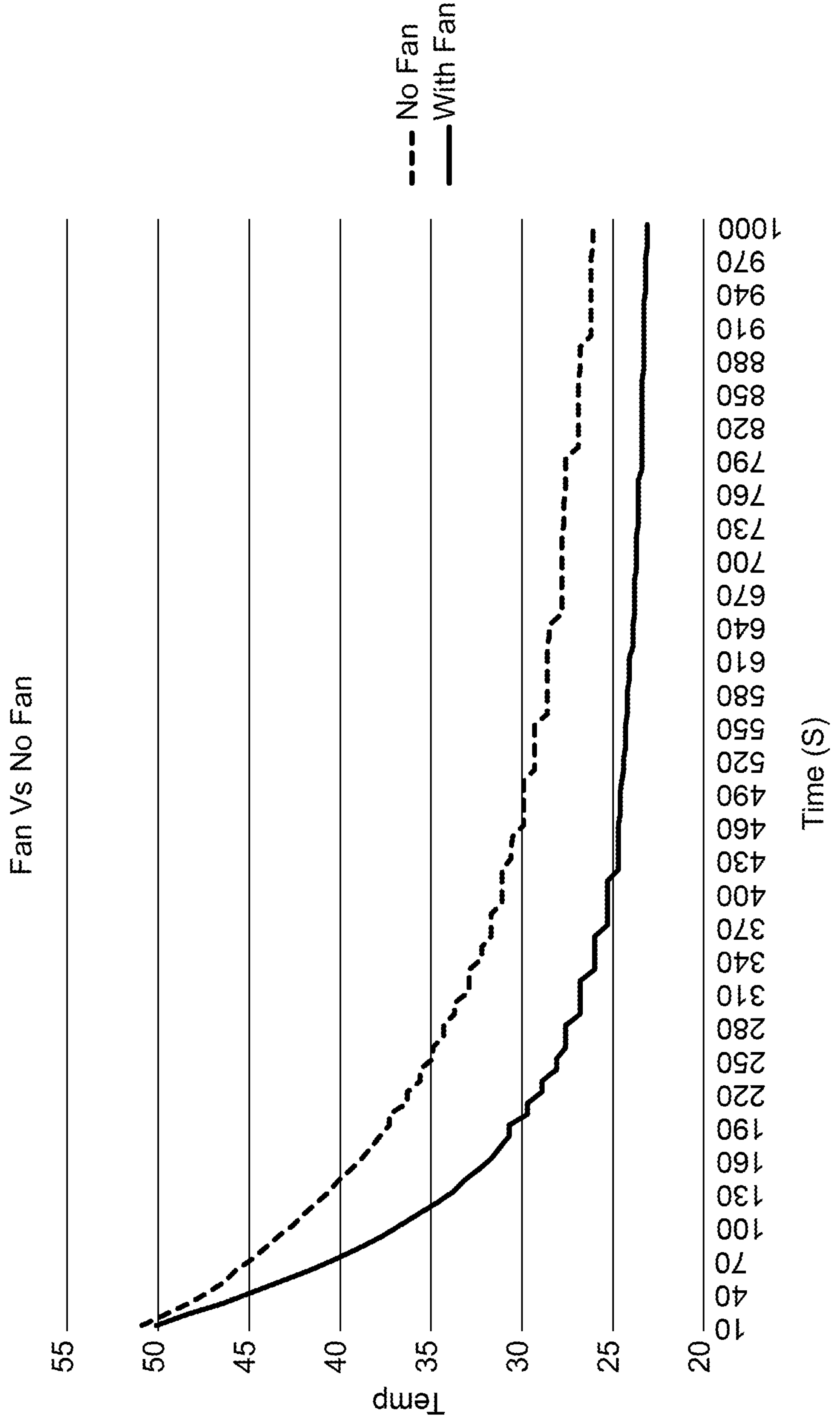
FIG. 10 is a graph of temperature at a receiver relative to time when a cooling element is operating, and when a fan is not operating.

In testing use of the cooling arrangement comprising the described housing arrangement 12 was found to cool the temperature at the high heat components 46. The results of this testing are illustrated in the graph of FIG. 10. FIG. 10 is a graph of temperature in degrees Celsius at the receiver relative to time in seconds when the cooling element, e.g., fan 70, is operating and when the cooling element, e.g., fan 70 is not operating. As can be seen, the temperature is consistently lower when the fan 70 is operating, than when the fan 70 is not operating. This protects the high heat components 46 from overheating and damaging themselves, other components of the receiver or the receiver housing 16.

Figure 11:
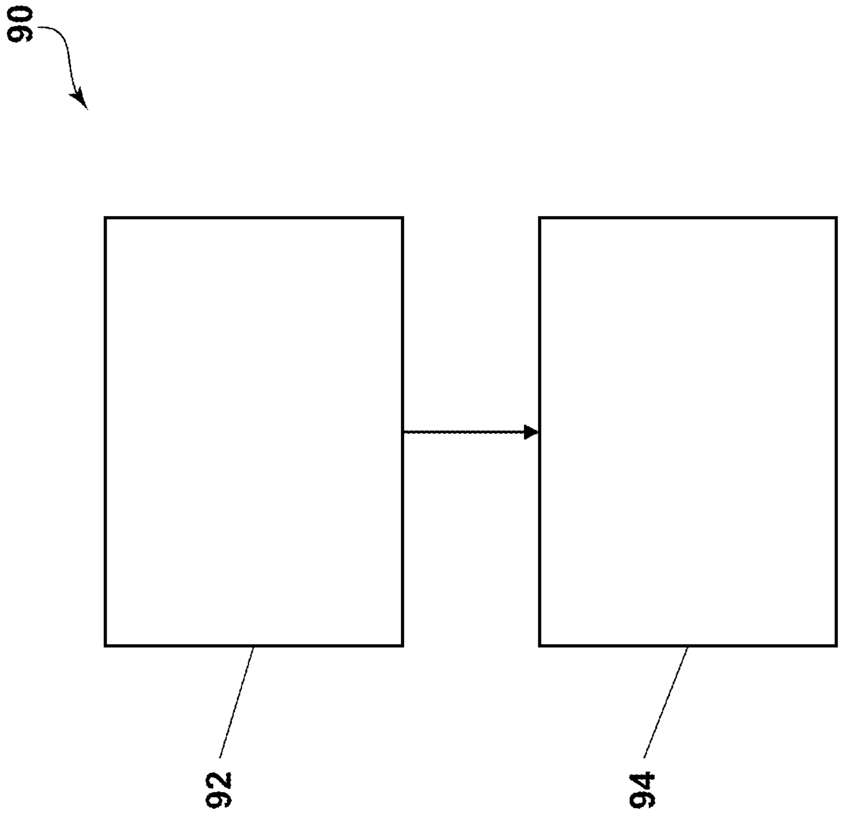
FIG. 11 is a flowchart of a method of cooling a receiver of a wireless power transfer system.

Turning now to FIG. 11, a flowchart of a method of cooling the receiver is illustrated. The method is generally identified by reference numeral 90. The method 90 comprises providing 92 the housing arrangement 12 for enclosing a receiver of a wireless power transfer system, and for enclosing the transmitter for transferring power to the receiver. As described above, the housing arrangement 12 provides a flow path A between a cooling element (fan 70) for cooling the receiver. The cooling element is powered by a power source at the transmitter or by the transmitter.

The method 90 further comprises operating 94 the cooling element to cool the receiver via the flow path. This may comprise operating the fan 70 to suck air from the receiver, or to force air over the receiver. The air may be drawn in at the receiver housing 16 via the cut-out 34 and exhaust through the intake 58 (which acts an exhaust) of the fan 70. Alternatively the air may be drawn in through the intake 58 in the transmitter housing 14 by the fan 70 and then expelled via the cut-out 34.

Figure 12:
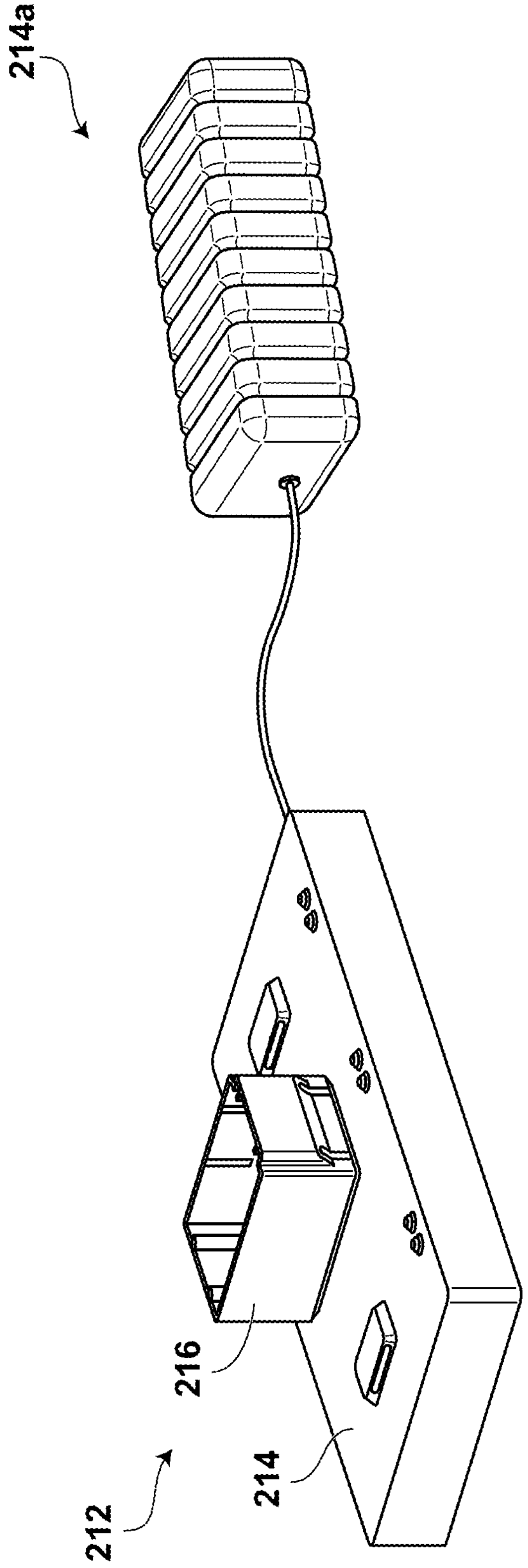
FIG. 12 is a perspective view of another embodiment of a cooling arrangement.

While a particular cooling arrangement has been described and illustrated in FIG. 2, one of skill in the art will appreciate alternatives are possible. In particular, in the arrangement illustrated in FIG. 2, the transmitter housing 14 may be engaged by a single receiver housing 16. In other arrangements, the transmitter housing 14 may be engaged by multiple receiver housings 16 at once. Turning now to FIG. 12, another arrangement of the cooling arrangement is illustrated. Like elements of this embodiment have reference symbols increased by "200" relative to the embodiment illustrated in FIG. 2. The transmitter and receiver housings comprise the same elements of the previously-described transmitter and receiver housings 14, 16 unless otherwise stated. In this embodiment, the transmitter housing 214 may be engaged by multiple receiver housing 216 at once. In fact, in the illustrated arrangement, three receiver housings 216 may be engaged with the single transmitter housing 214. One of skill in the art will appreciate more or fewer receiver housing 216 are possible. The transmitter housing 214 receives electrical power from a power source 214*a* external to the transmitter housing 214.

Although embodiments have been described above with reference to the figures, those of skill in the art will appreciate that variations and modifications may be made without departing from the scope thereof as defined by the appended claims.

The invention claimed is:

1. A cooling arrangement for a wireless power transfer system comprising a transmitter and a receiver for receiving electrical power from a transmitter, the cooling arrangement comprising:

- a housing arrangement for enclosing the receiver of the wireless power transfer system,
- the housing arrangement adapted to provide a flow path between a cooling element powered by the transmitter of the wireless power transfer system or a power source for powering the transmitter, and the receiver,
- the housing arrangement comprising:
  - a transmitter housing for enclosing the transmitter of the wireless power transfer system; and
  - at least one receiver housing for enclosing of the receiver of the wireless power transfer system,
  - the transmitter housing and receiver housing adapted to provide the flow path between the cooling element for cooling at least a portion of the transmitter enclosed in the transmitter housing, and the receiver enclosed in the receiver housing,
- wherein the transmitter housing encloses the cooling element,
- wherein the transmitter housing comprises at least one first opening to provide the flow path from the cooling element to the receiver, and
- wherein the transmitter housing comprises a raised pad and sidewalls extending therefrom, and wherein the at least one first opening is formed in the sidewalls.

2. The cooling arrangement of claim 1, wherein the housing arrangement is for enclosing the transmitter of the wireless power transfer system, the transmitter for transferring power to the receiver; or wherein the housing arrangement is for enclosing the cooling element for cooling the receiver.

3. The cooling arrangement of claim 1, wherein the housing arrangement comprises a plurality of openings to provide the flow path.

4. The cooling arrangement of claim 1, further comprising:

the cooling element for cooling at least a portion of the transmitter of the & wireless power transfer system, and the receiver.

5. The cooling arrangement of claim 1, wherein the raised pad or the at least one first opening is aligned with components of the receiver.

6. The cooling arrangement of claim 1, wherein the transmitter housing comprises at least one second opening to provide a flow path out of or into to the transmitter housing.

7. The cooling arrangement of claim 1, wherein the receiver housing comprises at least one first opening to provide the flow path from the receiver housing to the receiver enclosed in the receiver housing.

8. The cooling arrangement of claim 7, wherein the receiver housing comprises the at least one first opening to provide the flow path from the receiver housing to the receiver enclosed in the receiver housing, the at least one first opening adapted to receive the raised pad of the transmitter housing, and wherein the at least one first opening is adapted to circumscribe the raised pad.

9. The cooling arrangement of claim 7, wherein the receiver housing comprises at least one second opening to provide a flow path out of or into to the receiver housing.

10. The cooling arrangement of claim 1, wherein the housing arrangement is for enclosing a plurality of receivers for extracting electrical power from a field generated by the transmitter of the wireless power transfer system.

11. The cooling arrangement of claim 10, wherein the housing arrangement comprises:

a plurality of receiver housings, each receiver housing for enclosing the receiver for extracting electrical power from the field generated by the transmitter of the wireless power transfer system, wherein the transmitter housing and the plurality of receiver housings are adapted to provide at least one flow path between the cooling element for cooling at least a portion of the transmitter enclosed in the transmitter housing, and at least one receiver enclosed in one of the plurality of receiver housings.

12. The cooling arrangement of claim 11, wherein the transmitter housing comprises at least one opening for providing the flow path, and wherein at least one receiver housing of the plurality of receiver housings comprises at least one opening for providing the flow path.

13. The cooling arrangement of claim 12, wherein the transmitter housing and the plurality of receiver housings are adapted to provide a plurality of flow paths, each flow path between the cooling element and a respective receiver enclosed in a respective receiver housing of the plurality of receiver housings.

14. The cooling arrangement of claim 13, wherein the transmitter housing comprises the at least one opening for providing the flow path, and wherein each receiver housing of the plurality of receiver housings comprises the at least one opening to provide a respective flow path between the cooling element and the receiver enclosed in the receiver housing.

15. The cooling arrangement of claim 1, wherein the transmitter housing comprises at least one locator for locating the receiver housing on the transmitter housing.

16. A wireless power transfer system comprising a transmitter, a receiver for receiving electrical power from a transmitter, and a cooling arrangement comprising:

a housing arrangement for enclosing the receiver, the housing arrangement adapted to provide a flow path between a cooling element powered by the transmitter or a power source for powering the transmitter, and the receiver, the housing arrangement comprising:

a transmitter housing for enclosing the transmitter of the wireless power transfer system; and at least one receiver housing for enclosing of the receiver of the wireless power transfer system, the transmitter housing and receiver housing adapted to provide the flow path between the cooling element for cooling at least a portion of the transmitter enclosed in the transmitter housing, and the receiver enclosed in the receiver housing, wherein the transmitter housing encloses the cooling element, wherein the transmitter housing comprises at least one first opening to provide the flow path from the cooling element to the receiver, and wherein the transmitter housing comprises a raised pad and sidewalls extending therefrom, and wherein the at least one first opening is formed in the sidewalls.

17. A method of cooling a receiver of a wireless power transfer system, the method comprising:

providing a housing arrangement for enclosing a receiver of a wireless power transfer system, and for enclosing a transmitter for transferring power to a receiver of a wireless power transfer system, the housing arrangement adapted to provide a flow path between a cooling element powered by the transmitter or a power source for powering the transmitter, and the receiver, the housing arrangement comprising:

a transmitter housing for enclosing the transmitter of the wireless power transfer system; and at least one receiver housing for enclosing of the receiver of the wireless power transfer system, the transmitter housing and receiver housing adapted to provide the flow path between the cooling element for cooling at least a portion of the transmitter enclosed in the transmitter housing, and the receiver enclosed in the receiver housing, wherein the transmitter housing encloses the cooling element, wherein the transmitter housing comprises at least one first opening to provide the flow path from the cooling element to the receiver, and wherein the transmitter housing comprises a raised pad and sidewalls extending therefrom, and wherein the at least one first opening is formed in the sidewalls; and operating the cooling element to cool the receiver via the flow path.

* * * * *